United States Patent
Hazel

(10) Patent No.: US 10,012,685 B2
(45) Date of Patent: Jul. 3, 2018

(54) METHOD FOR LOCATING AN ELECTRICAL DEFECT IN AN UNDERWATER ELECTRICAL DISTRIBUTION MODULAR SYSTEM

(71) Applicant: SCHNEIDER ELECTRIC INDUSTRIES SAS, Rueil-Malmaison (FR)

(72) Inventor: Terence Hazel, Grenoble (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 300 days.

(21) Appl. No.: 14/780,748

(22) PCT Filed: Mar. 4, 2014

(86) PCT No.: PCT/FR2014/050481
§ 371 (c)(1),
(2) Date: Sep. 28, 2015

(87) PCT Pub. No.: WO2014/154967
PCT Pub. Date: Oct. 2, 2014

(65) Prior Publication Data
US 2016/0061878 A1    Mar. 3, 2016

(30) Foreign Application Priority Data

Mar. 29, 2013 (FR) .................................. 13 52922

(51) Int. Cl.
*E21B 7/12* (2006.01)
*G01R 31/08* (2006.01)
(Continued)

(52) U.S. Cl.
CPC ........ *G01R 31/085* (2013.01); *E21B 33/0385* (2013.01); *E21B 41/04* (2013.01);
(Continued)

(58) Field of Classification Search
CPC .. G01R 31/085; G01R 31/005; G01R 31/086; E21B 41/04; E21B 41/0007; E21B 33/0385; H02G 9/02
(Continued)

(56) References Cited

U.S. PATENT DOCUMENTS 4,142,770 A * 3/1979 Butler, Jr. ............ H01R 13/523
                                                        439/140
5,902,978 A * 5/1999 Zehnder ............... H01H 33/901
                                                         218/48

(Continued)

OTHER PUBLICATIONS

International Search Report dated Jul. 18, 2014 in PCT/FR2014/050481.

(Continued)

*Primary Examiner* — Farhana Hoque
(74) *Attorney, Agent, or Firm* — Oblon, McClelland, Maier & Neustadt, L.L.P.

(57) ABSTRACT

A method of locating an electrical defect in an underwater electrical distribution modular system including a power line along which are disposed: a line head module including an isolator; a line termination module; optionally, one or more intermediate modules; a set of electrical connectors linkable under the water. The method includes, after opening the isolator of the head module following detection of an electrical defect downstream on the line: disconnection, by a remotely operated underwater vehicle, of a male connector and female connector ensuring electrical connection between two underwater modules; fitting a dielectric stopper on the male connector disconnected from the female connector by a remotely operated underwater vehicle; closing the isolator of the head module; and verification of a detection of a defect on the line downstream of the isolator of the head module.

9 Claims, 2 Drawing Sheets

(51) Int. Cl.
  *E21B 33/038* (2006.01)
  *H02G 9/02* (2006.01)
  *E21B 41/04* (2006.01)
  *G01R 31/00* (2006.01)

(52) U.S. Cl.
  CPC ............ *G01R 31/005* (2013.01); *H02G 9/02* (2013.01); *G01R 31/086* (2013.01)

(58) Field of Classification Search
  USPC .................................. 324/522; 166/336, 339
  See application file for complete search history.

(56) References Cited

U.S. PATENT DOCUMENTS

2009/0288836 A1* 11/2009 Goodall .................. F16L 1/26
  166/336
2013/0286546 A1* 10/2013 Hazel ...................... H02B 7/00
  361/602

OTHER PUBLICATIONS

Henri Baerd, et al., "Ormen Lange Subsea Compression Station Pilot" PCIC Europe 2010 Conference Record, XP031717636, Jun. 15, 2010, 9 Pages.

* cited by examiner

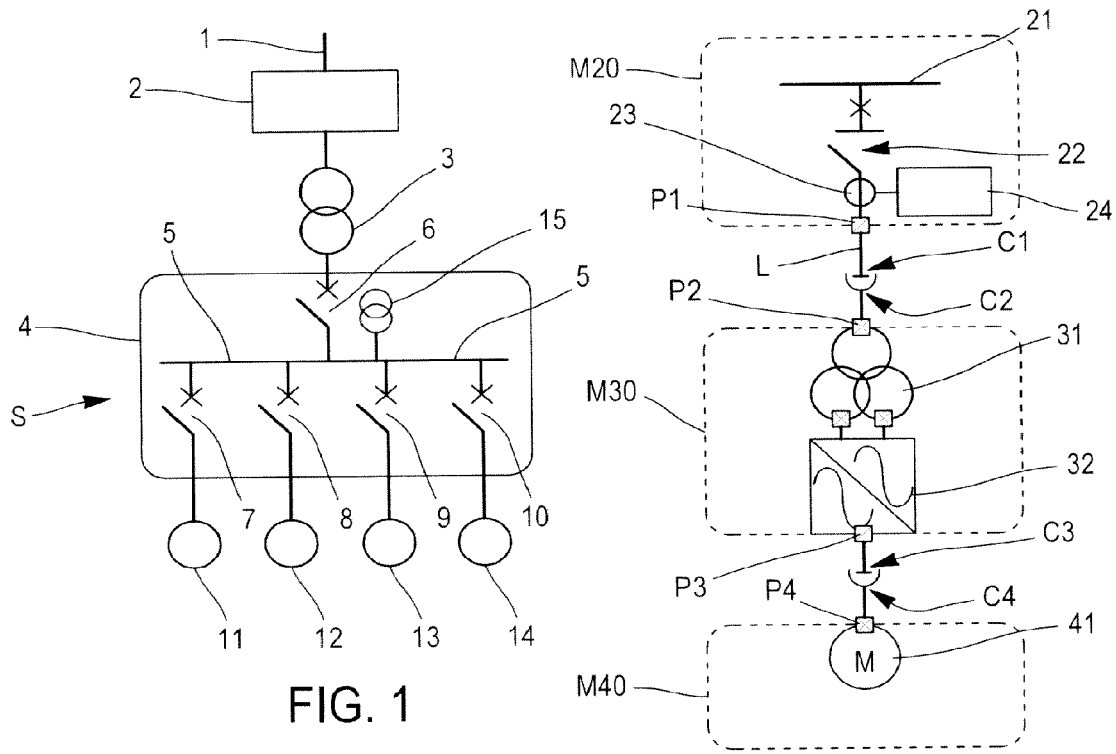
FIG. 1
FIG. 2
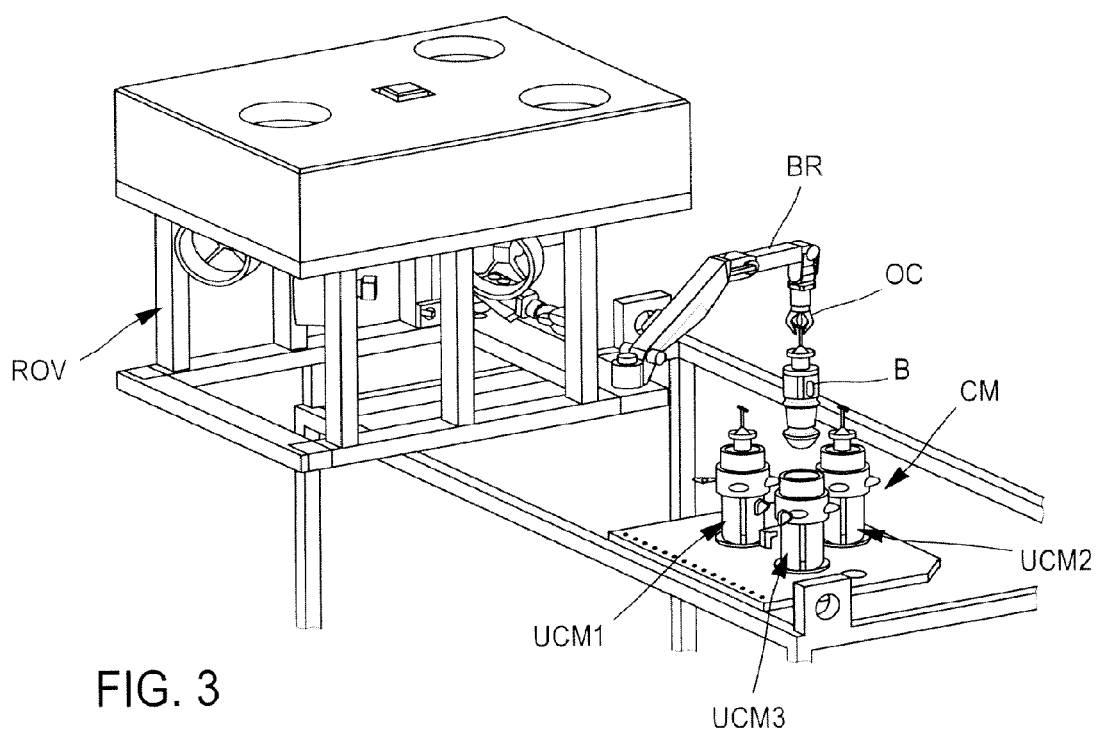
FIG. 3

METHOD FOR LOCATING AN ELECTRICAL DEFECT IN AN UNDERWATER ELECTRICAL DISTRIBUTION MODULAR SYSTEM

TECHNICAL FIELD

The field of the invention is that of modular submarine electrical distribution systems. The invention more precisely relates to the localization of electrical faults in such systems.

PRIOR ART

Submarine equipment of an electrical distribution system is installed on the ocean bed at a depth which may be as much as 10 000 feet, i.e. more than 3000 meters. Access to such equipment is possible only with a remotely operated submarine vehicle (or ROV: "Remotely Operated Vehicle"). For this reason, the solutions used for surface electrical installations can only very rarely be used for submarine electrical installations. This is the case, in particular, with electrical fault localization solutions.

Submarine equipment is generally in the form of a module, insofar as it is housed in a relatively small containment, which allows its weight to be limited to a few tons and its dimensions to less than 6 meters, in order to make it easier to install and recover. The invention also concerns modules with greater weight and size, for example 200 tons and 17 meters in length.

The various modules which make up a modular submarine electrical distribution system are interconnected by means of submarine cables. In order to allow separation of the various modules on the ocean bed, underwater-connectable electrical connectors ("wet mate connectors") are used. This allows each power module to be isolated and thus individually recovered.

In general, there is a desire to have a solution for localizing the side of an underwater-connectable electrical connector on which an electrical fault has occurred.

Electrical fault localization solutions have been proposed which consist in including additional current transformers outside the containments in order to detect the flow of a fault current induced by the electrical fault. However, the additional current transformers and the associated sensitive cabling are then exposed to seawater and the debris contained therein, which leads to additional malfunction modes which may reduce the overall availability of the submarine electrical distribution system. Penetrators are furthermore necessary in order to connect the additional current transformers to devices capable of detecting the fault current. Moreover, these penetrators increase the risk of a leak of seawater into the submarine containments, thereby reducing the availability of the system.

More generally, the electrical fault localization and/or monitoring solutions for submarine installations require the fitting of additional dedicated components: see also US 2009/0288836.

SUMMARY OF THE INVENTION

The object of the invention is to provide a solution for electrical fault localization in a modular submarine electrical distribution system which does not have the drawbacks mentioned above. To this end, the invention provides a method for localizing an electrical fault in a modular submarine electrical distribution system, comprising a power line (L) along which the following are arranged:

a submarine line head module comprising a circuit breaker and a protective relay configured in order to detect an electrical fault downstream of the circuit breaker on the line;

a submarine line termination module;

optionally, one or more intermediate submarine modules in series between the submarine line head module and the submarine line termination module;

a set of underwater-connectable electrical connectors, making it possible to electrically connect the submarine modules along the line, a male connector and a female connector providing the electrical connection between two consecutive submarine modules along the line, the method comprising the following steps carried out after opening of the circuit breaker of the submarine line head module following the detection of an electrical fault downstream on the line:

a) disconnection by a remotely operated submarine vehicle of the male connector and the female connector providing the electrical connection between two consecutive submarine modules along the line;

b) fitting of a dielectric plug on the male connector disconnected from the female connector by a remotely operated submarine vehicle;

c) closure of the circuit breaker of the submarine line head module;

d) verification of detection of a fault on the line downstream of the circuit breaker of the line module.

Certain preferred but nonlimiting aspects of the method are as follows:

step a) comprises disconnection of the male connector and of the female connector providing the electrical connection between the submarine line termination module and the submarine module which is located directly upstream thereof on the line;

the submarine module located directly upstream of the submarine line termination module on the line is an intermediate submarine module;

when step d) concludes that there is a fault on the line downstream of the circuit breaker of the line head module, steps a) to d) are repeated while substituting said intermediate submarine module for the submarine line termination module for disconnecting said intermediate submarine module from the submarine module which is located directly upstream thereof on the line;

steps a) to d) are repeated so long as step d) concludes that there is a fault on the line downstream of the circuit breaker of the line head module, while at each iteration substituting for the intermediate submarine module the submarine module which is located directly upstream thereof on the line;

before repetition of steps a) to d), it comprises removal of the dielectric plug fitted on the male connector during step b) and reconnection of the male connector and the female connector which were disconnected during step a);

it comprises, between steps a) and b), a step consisting in bringing the female connector from a disconnection position in alignment, in which the female connector is disengaged from the male connector in alignment therewith, to a remote disconnection position;

step b) is carried out by a remotely operated submarine vehicle.

Preferably, the invention is applied to and relates to a device for connecting a cable with termination by a female connector for a modular submarine electrical distribution system, comprising:

a chassis;
a cable termination support plate comprising a fixed portion connected to the chassis and a mobile portion which can be moved in translation relative to the chassis so that the female connector can be moved between a service position, in which the female connector and a male connector are connected, and a disconnection position in alignment, in which the female connector is disconnected from the male connector but in alignment therewith;
a chassis support which can be maneuvered in order to make it possible to move the female connector between the disconnection position in alignment and a remote disconnection position.

BRIEF DESCRIPTION OF THE DRAWINGS

Other aspects, objects, advantages and characteristics of the invention will become more apparent upon reading the following detailed description of preferred embodiments thereof, which is given by way of nonlimiting example and made with reference to the appended drawings, in which:

FIG. 1 is a diagram illustrating a submarine electrical distribution system;

FIG. 2 is a diagram illustrating a power line of a submarine electrical distribution system, in which an electrical fault can be localized by means of the method according to the invention;

FIG. 3 illustrates the fitting of a dielectric plug on a male connector by a remotely operated submarine vehicle;

DETAILED DESCRIPTION OF PARTICULAR EMBODIMENTS

Figure 4:
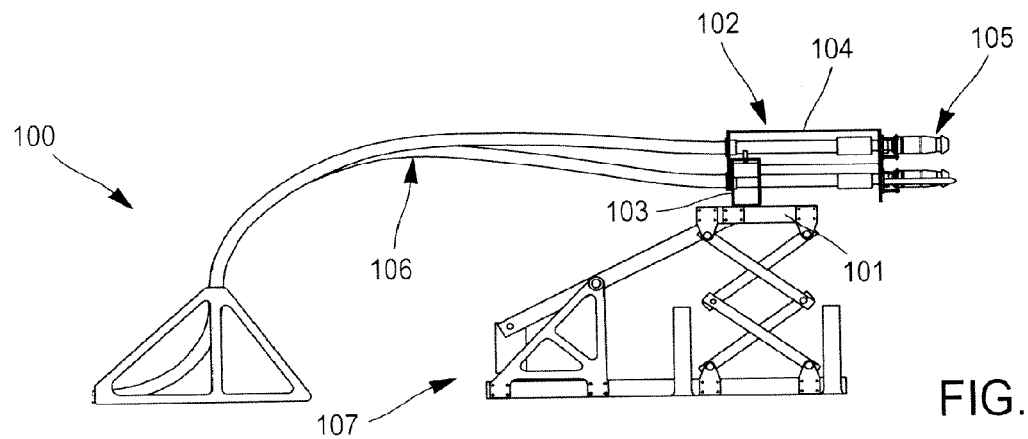
FIGS. 4-6 illustrate various positions which can be occupied by a unit for connecting a cable with termination by a female connector according to one possible embodiment of a second aspect of the invention.

The invention relates to a method for localizing an electrical fault in a modular submarine electrical distribution system, of which FIG. 1 gives a schematic illustration.

In this FIG. 1, the modular submarine electrical distribution system S comprises a submarine circuit breaker module 4 which receives the electrical power from a submarine umbilical termination unit 2 coupled to an umbilical cable 1, after reduction in the case illustrated by a step-down transformer 3, which is configured for example in order to reduce the voltage from 100 kV to 33 kV.

In the example of FIG. 1, the circuit breaker module 4 comprises five circuit breakers 6-10. One of the ends of each of the circuit breakers is connected to a set of bars 5 and the other end, referred to as the free end, is coupled to a power source or to a load, depending on the desired configuration. The circuit breaker 6 is thus arranged so that its free end receives the power from the umbilical cable 1. The free end of each circuit breaker 7-10 is for its part coupled to a submarine load module 11-14. The circuit breaker module 4 may furthermore comprise a voltage transformer 15 for purposes of monitoring and protection.

The invention aims to make it possible to localize electrical faults along a power line between the circuit breaker module 4 and one of the load modules 11-14. FIG. 2 illustrates an example of such a power line L, the description of the method according to the invention being given below with reference to this FIG. 2.

Upstream of the power line L, there is a submarine line head module M20 comprising a set of bars 21 which, like the set of bars 5 of FIG. 1, is intended to receive the electrical power from an umbilical cable, and a line head circuit breaker 22, of which one end is connected to the set of bars and the other end is intended to be coupled to a load. The line head module M20 furthermore comprises a protective relay 24 capable of triggering opening of the line head circuit breaker 22, particularly in the event of an electrical fault detected downstream on the line L.

In one embodiment, the protective relay 24 is associated with a current transformer 23 arranged in order to measure the phase or homopolar current downstream of the line head circuit breaker 22, and is configured in order to compare this current with a threshold in order to identify an electrical fault downstream of the circuit breaker on the line and to signal this to a control unit of the electrical distribution system. The protective relay may, in particular, incorporate protection against ground faults and surges.

At the termination of the power line L, there is a submarine line termination module M40, which typically comprises a load 41 to which the power is to be delivered, in particular a power more than 100 kVA, for example the motor of a booster pump or a compressor.

Along the line, there may furthermore be one or more intermediate submarine modules arranged in series between the line head module M20 and the line termination module M40. In the example of FIG. 2, there is thus an intermediate submarine module M30 which comprises a step-down transformer 31 and a variable frequency drive (VFD) device 32, which provides an electrical power with a variable frequency to the line termination module M40.

In another embodiment, the detection of an electrical fault downstream of the line head circuit breaker is carried out not by the protective relay of the line head module but, for example, by an intermediate module, such as the intermediate module M30 of FIG. 2, which then has detectors of electrical faults (typically ground faults and surges) in the line termination module. In such a figurative case, the invention makes it possible to identify which equipment items downstream of the intermediate module with electrical fault detectors are defective.

Along the power line L, there is also a set of underwater-connectable electrical connectors C1-C4, which make it possible to provide connection of the submarine modules in pairs. More precisely, two consecutive modules on the line L are connected together by means of a male connector C1, C3 and a female connector C2, C4 (each connector, male or female, generally comprising a plurality of connection units, typically three connection units). In the example of FIG. 2, there is thus a male connector C1 on the side of the line head module M20, which can be connected to a female connector C2 on the side of the intermediate module M30 in order to provide electrical connection of the line head module and the intermediate module. There is furthermore a male connector C3 on the side of the intermediate module M30, which can be connected to a female connector C4 on the side of the line termination module M40 in order to provide electrical connection of the intermediate module and the line termination module. Each of its connectors C1, C4 is arranged at the end of a cable coupled to the respective module by means of a containment penetrator P1-P4.

When a fault is detected downstream of the circuit breaker 22 on the line, the method according to the invention comprises a first step consisting in opening the circuit breaker in order to isolate the circuit, this opening being followed by disconnection of the male connector and the female connector providing the electrical connection between two consecutive submarine modules on the line.

This disconnection is typically carried out by a remotely operated submarine vehicle ROV, as will be described in more detail below.

In a first embodiment of the method, the line termination module M40 is typically disconnected from the module which is directly upstream thereof on the line, namely the line head module M20 if there is no intermediate module, or an intermediate module M30 as is the case in FIG. 2. As detailed below, this in fact makes it possible to check whether the electrical fault is due to the section disconnected from the power line, namely whether the fault is due to the line termination module M40 or the cable with termination by a female connector C4, which connects it to the module that is directly upstream thereof on the line. When it has been verified that the that the fault is not due to the disconnected segment, the method is repeated while this time disconnecting the male/female connectors (the connectors C1, C2 connecting the line head module M20 and the intermediate module M30 in the example of FIG. 2) directly upstream on the line of the previously disconnected connectors. This then makes it possible to check whether the fault is due to the module immediately upstream of the line termination module or the cable or cables coming therefrom (intermediate module M30 and cables with termination by connectors C2, C3 in the example of FIG. 2). The method may thus be repeated until the line head module M20 is reached.

An underwater-connectable male connector is relatively simple and corresponds essentially to an electrical contact made of copper, or of an alloy with suitable properties, which is exposed to seawater when it is disconnected from the corresponding female connector. The female connector is for its part more complex and contains an insulating fluid, which makes it possible to avoid any exposure to seawater when it is disconnected from the corresponding male connector.

In a second step of the method, a dielectric plug is fitted on the male connector disconnected from the female connector during the first step. This dielectric plug makes it possible to isolate the male connector from the seawater and makes it possible for the power line to be placed under full voltage as far as the male connector.

This second step is carried out by means of a remotely operated submarine vehicle ROV. As represented in FIG. 3, the vehicle ROV comprises an arm BR, at the end of which a coupling tool OC is mounted, which makes it possible to fit a dielectric plug B on a male connector UCM. The male connector in this case comprises three male connection units UCM1-UCM3, two of which UCM1, UCM2 are already isolated by means of a dielectric plug, while a dielectric plug B is in the course of being installed on the third unit UCM3. Once the plug has been installed, the vehicle ROV locks it in position by turning it through 90° using the same coupling tool OC.

In a third step of the method, the line head circuit breaker 22 of the line head module M20 is closed. Returning to the example of FIG. 2, and in a first embodiment of the method, the closure of the circuit breaker 22 after the plug has been fitted on the previously disconnected male connector C3 makes it possible to apply the full voltage of the system to the portion of the power line upstream of the previously disconnected male connector C3.

In a fourth step of the method, a check is made, for example with the protective relay 24, whether a fault is detected downstream of the line head circuit breaker 22.

If a fault is not detected on the line L downstream of the line head circuit breaker, the presence of a fault is identified in the submarine line termination module or in the cable connecting the submarine line termination module to the female connector C4 capable of providing the electrical connection of said submarine line termination module to the submarine module located directly upstream on the line. It is then possible to change only the submarine line termination module.

If a fault is detected on the line L downstream of the line head circuit breaker, said circuit breaker is opened, for example on reception of an opening signal from the protective relay, and the presence of the fault is then identified upstream of the male connector C3 disconnected in the first step.

If there are one or more intermediate modules between the line head module and the line termination module, an attempt may also be made to identify which of the modules (or the associated cable or cables) upstream of the termination module has the electrical fault. In order to do so, the four steps of the method are initially repeated while substituting the intermediate module M30 for the line termination module for disconnecting said intermediate module from the module which is directly upstream thereof on the line (line head module M20 in the example of FIG. 2). It will have been understood that the four steps of the method may be repeated so long as the fourth step concludes that there is a defect downstream of the line head circuit breaker, while at each iteration substituting for an intermediate module the module which is directly upstream thereof on the line, until reaching the line head module, which is then disconnected from the module that is directly downstream thereof on the line.

In one embodiment, before the steps of the method are repeated, the plug fitted during the previous second step is removed and the male and female connectors disconnected during the previous first step are reconnected.

In one embodiment of the method, it comprises, between the first and second steps described above, a step consisting in bringing the female connector from a disconnection position in alignment, in which the female connector is disengaged from the male connector in alignment therewith, to a remote disconnection position, in particular a remote position in which the female connector is separated from the male connector by a distance sufficient to make it possible to fit the dielectric plug on the male connector during the second step, or respectively to remove the previously fitted dielectric plug, using a remotely operated submarine vehicle ROV.

In this way, the invention is fully compatible with being carried out by a vehicle ROV, which has the advantage of significantly reducing the time taken to localize the fault, because implementation of the invention does not require the use of a surface vessel, for which the availability and the meteorological conditions may often delay the operations by several months. It furthermore leads to a decrease in the risk of damaging the submarine modules and the interconnection cables forming the modular submarine electrical distribution system. Furthermore, the invention does not require sensors or additional power equipment, thereby avoiding the introduction of additional malfunction modes which could reduce the availability of the modular submarine electrical distribution system.

Figure 5:
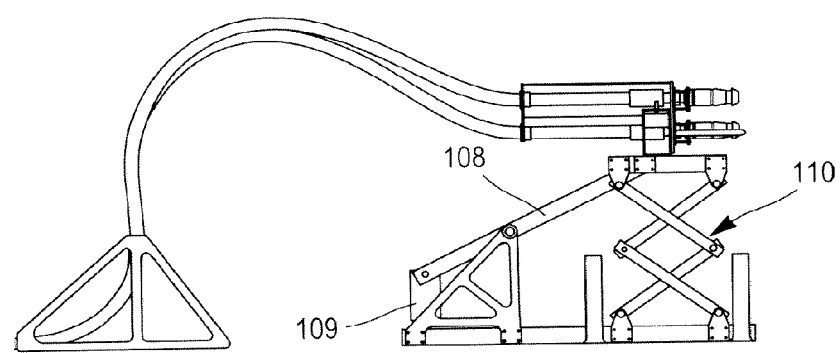
Figure 6:
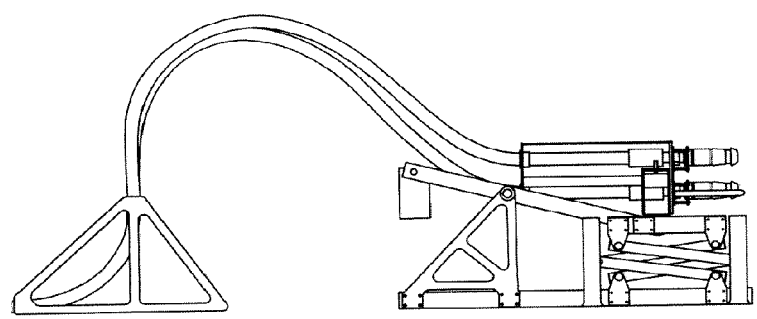

FIGS. 4-6 represent a device 100 for connecting a cable with termination by a female connector for a modular submarine electrical distribution system, which may be used in the scope of the invention, in particular in order to bring the female connector into a remote position in which it is separated sufficiently from the male connector in order to make it possible for the dielectric plug to be fitted or removed by the vehicle ROV.

The device 100 comprises a chassis 101, a cable termination support plate 102 comprising a fixed portion 103 connected to the chassis and a mobile portion 104 which can be moved in translation relative to the chassis 101 so that the female connector 105 (which comprises a plurality of female connection units) with the termination of the cable 106 (in reality a cable with a female connection unit) can be moved between a service position, in which the female connector and a male connector are connected, and a disconnection position in alignment, in which the female connector is disconnected from the male connector but in alignment therewith. FIG. 4 illustrates in this regard the device 100 with the female connector 105 in the service position (the male connector assumed to be on the right in the figure not being represented). FIG. 5 for its part illustrates the device 100 with the female connector 105 in the disconnection position in alignment, after retraction of the mobile portion 104.

The movement between the positions of service and disconnection in alignment may, in particular, be carried out by a vehicle ROV which advances/retracts the mobile portion 105 with respect to the cable termination support plate 102.

The device 100 for connection of a cable with termination by a female connector furthermore comprises a chassis support 107 which can be maneuvered in order to make it possible to move the female connector between the disconnection position in alignment represented in FIG. 5 and a remote disconnection position represented in FIG. 6. In the embodiment represented in FIG. 6, said remote disconnection position is a lowered position in which the female connector is no longer in line with the connector.

The maneuverable chassis support 170 comprises for example a lever arm 108, at one end of which a counterweight 109 is positioned and at the other end of which the chassis 101 is mounted. It furthermore comprises a lifting device 110 supporting the chassis, which can be retracted/extended in order to lower/raise the chassis and thus bring the female connector to a remote disconnection position/disconnection position in alignment. The movement between the positions of disconnection in alignment and remote disconnection may, in particular, be carried out by a vehicle ROV. In one possible embodiment, the lifting device 110 comprises an endless screw which can be rotated by the coupling tool OC of a vehicle ROV in order to retract/lower the lifting device and thus lower/raise the chassis 101.

The device 100 for connection of a cable with termination by a female connector is advantageous insofar as placement in a remote position can be carried out by a vehicle ROV, even though such a vehicle cannot support the considerable weights involved in submarine electrical distribution systems (each module weighs more than one tonne—the cables themselves have a cross section of more than 50 mm$^2$, conventionally of the order of one hundred mm$^2$). The large cross section of the cables furthermore requires lengths sufficient for changes in direction, since the radii of curvature of these cables must not be less than values defined in order to avoid damage. The use of a cable connection device makes it possible to comply with the minimum tangences during use, the device according to the invention furthermore making it possible to separate the cable with female termination sufficiently from the male connector in order to make it possible to fit, and respectively remove, the dielectric plug on the male connector using a vehicle ROV.

The invention claimed is:

1. A method for localizing an electrical fault in a modular submarine electrical distribution system, the method comprising, after opening a circuit breaker of a submarine line head module following detection of an electrical fault downstream of the submarine line head module on the power line:
    a) disconnecting, using a remotely operated submarine vehicle, a male connector and a corresponding female connector providing an electrical connection between two consecutive submarine line modules of the modular submarine electrical distribution system along the power line;
    b) fitting a dielectric plug on the male connector disconnected from the female connector using the remotely operated submarine vehicle;
    c) closing the circuit breaker of the submarine line head module using circuitry of the submarine line head module; and
    d) verifying detection of a fault on the power line downstream of the circuit breaker of the submarine line head module using the circuitry of the submarine line head module.

2. The method as claimed in claim 1, wherein the two consecutive submarine line modules are a submarine line termination module and a submarine line module located directly upstream of the submarine line terminal module on the power line.

3. The method as claimed in claim 2, wherein the submarine line module located directly upstream of the submarine line termination module on the power line is the submarine line head module.

4. The method as claimed in claim 2, wherein the submarine line module located directly upstream of the submarine line termination module on the power line is an intermediate submarine line module between the submarine line termination module and the submarine line head module.

5. The method as claimed in claim 4, wherein, when said d) verifies that there is a fault on the power line downstream of the circuit breaker of the submarine line head module, said a) to said d) are repeated while substituting an intermediate submarine line module for the submarine line termination module for said a) for disconnecting the intermediate submarine line module from the submarine line module which is located directly upstream of the submarine line termination module on the power line.

6. The method as claimed in claim 5, wherein said a) to said d) are repeated so long as said d) verifies that there is a fault on the power line downstream of the circuit breaker of the submarine line head module using the circuitry of the submarine line head module, while at each repeating substituting for the intermediate submarine line module the submarine module which is located directly upstream of the submarine line termination module on the power line.

7. The method as claimed in claim 5, further comprising, before repeating said a) to said d), removing a dielectric plug fitted on the male connector as part of said b) using the remotely operated submarine vehicle; and reconnecting the male connector and the female connector disconnected as part of said a) using the remotely operated submarine vehicle.

8. The method as claimed in claim 1, further comprising, between said a) and said b), bringing the female connector from a disconnection position in which the female connector is disengaged from the male connector in alignment with the female connector, to a remote disconnection position in which the female connector is disengaged from the male connector and not in alignment with the female connector, using the remotely operated submarine vehicle.

9. The method as claimed in claim 1, wherein said d) is performed using a protective relay as the circuitry of the submarine line head module.

* * * * *